United States Patent [19]

Nowosad et al.

[11] Patent Number: 4,581,577
[45] Date of Patent: Apr. 8, 1986

[54] CONTINUITY DETECTING APPARATUS

[75] Inventors: David K. Nowosad, Courtenay; George E. Sudletsky, Ottawa, both of Canada

[73] Assignee: Her Majesty the Queen in right of Canada, as represented by the Minister of National Defence of Her Majesty's Canadian Government, Ottawa, Canada

[21] Appl. No.: 556,885

[22] Filed: Dec. 1, 1983

[30] Foreign Application Priority Data

Dec. 15, 1982 [CA] Canada ............................ 417753

[51] Int. Cl.⁴ .................. G01R 19/16; G01R 31/02
[52] U.S. Cl. ........................................ 324/66; 324/52
[58] Field of Search ................ 324/51, 52, 66, 73 R

[56] References Cited

U.S. PATENT DOCUMENTS

| 2,892,153 | 6/1959 | Neill | 324/66 |
| 3,181,062 | 4/1965 | Scarlett | 324/66 |
| 3,252,087 | 5/1966 | Parke | 324/66 |
| 3,740,644 | 6/1973 | Schag | 324/66 |
| 3,772,685 | 11/1973 | Masi | 324/66 |

FOREIGN PATENT DOCUMENTS 618032  4/1961  Canada ............................ 324/66

Primary Examiner—Stanley T. Krawczewicz
Assistant Examiner—Jose M. Solis
Attorney, Agent, or Firm—Anthony T. Lane; Jeremiah G. Murray; Edward Goldberg

[57] ABSTRACT

A continuity detecting apparatus for testing the continuity of conductors in damaged cables, comprises at least two test cables, each having a proximal end and distal end. The distal end of each test cable is adapted to be electrically connected to a respective end of a conductor to be tested. The apparatus includes a detector adapted to provide an output signal in response to an input signal exceeding a predetermined threshold level, a device for connecting the proximal end of at least one of the cables to a signal source and the proximal end of another of the remaining cables to the detector, and an indicator responsive to the output signal for providing an indication of current flow through a conductor connected between the distal ends of the one and the other cables.

18 Claims, 4 Drawing Figures

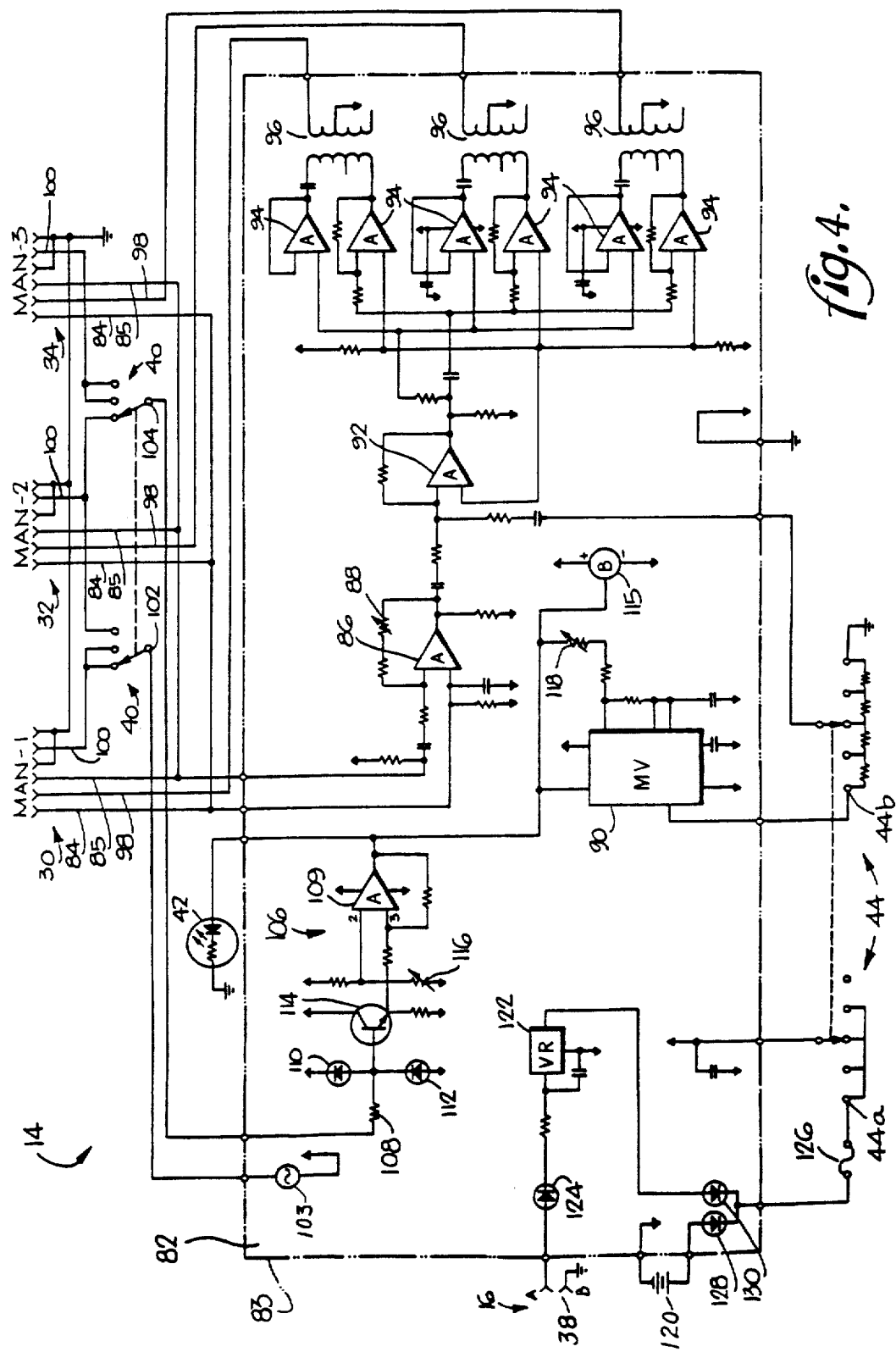

CONTINUITY DETECTING APPARATUS

FIELD OF THE INVENTION

This invention relates to an electrical continuity testing apparatus.

BACKGROUND OF THE INVENTION

There are numerous situations in which there is a need for an electrical continuity testing apparatus for use in repairing damaged electrical cables having a multiplicity of conductors. The repair of damaged electrical cables involves correlating the severed or damaged ends of the conductors of the cable with their opposite ends and restoring continuity. This process is relatively simple when the damaged cable is relatively short and readily accessible and where technicians can communicate with one another by voice contact. However, the task is rather difficult when the cable is long, relatively inaccessible, must be repaired in situ and there is a high environmental noise level. Such may be the case, for example, in aircraft and ships where cables may have a length of 100 feet or more, the ends and damaged portions of the cables are located in different compartments, and other structural repairs are concurrently in the process of being effected, thereby resulting in a high noise environment.

SUMMARY OF THE INVENTION

It is therefore the primary object of the present invention to provide an apparatus which facilitates the tracing and restoring of the continuity of damaged cables in situ.

In accordance with one aspect of the invention, there is provided an apparatus having an electrical circuit including a continuity detector and indicator and at least two test cables. Each cable has a proximal end adapted to be connected to the electrical circuit and a distal end employed by a technician at an appropriate location with respect to the damaged cable such as at the ends and the point of severance of the damaged cable. The distal ends of the cables are provided with probes for making electrical contact with the ends of the conductors of the damaged cable. The electrical circuit includes means adapted to connect the test probe of any one of the test cables to a signal source and the probe of any of the remaining test cables to the detector.

Thus, when the probe of one test cable is placed in electrical contact with the end of one conductor and the probe of the other test cable is placed in electrical contact with the other end of that conductor, the circuit is completed and current flows from one test cable and probe, through the conductor and the other probe and test cable to the detector. The detector activates the indicator which signals to the technicians that the opposite ends of the conductor have been identified.

The preferred form of the invention includes three test cables; one test cable is employed by one technician at the point of severance of the damaged cable and the other two are employed by two other technicians at the ends of the damaged cable. The electrical circuit includes a switch for selectively activating any two of the three test cables and connecting them to the signal source and detector in the manner mentioned above.

In use, the switch is positioned so as to activate the test cables associated with the center technician and one end technician. These two technicians identify the opposite ends of one conductor by the end technician placing his probe in contact with the end of one conductor and the center technician sequentially placing his probe in contact with the end conductor at the point of severance until the indicator is activated. The switch is then positioned to activate the test cables associated with the center technician and the other end technician. These technicians proceed to locate the mate of the identified conductor. When that is achieved, the conductor is repaired and the switch is positioned to activate the test cables associated with the end technicians and deactivate the center technician's test cable. The end technicians place their probes in contact with the ends of the repaired conductor to confirm that the conductor has been properly identified and repaired. The procedure is repeated for each of the remaining conductors.

Where voice contact is insufficient to provide adequate communication between technicians, the apparatus provides continuous communication between each technician by means of headsets, including earphones and microphones, connected to the distal ends of the test cables and in communication with one another via the test cables and electrical circuit. The electrical circuit amplifies microphone signals and feeds them together with continuity indicator signals to the earphones of each headset.

In accordance with a still further aspect of the present invention, there is provided a novel test probe which facilitates the continuity identification task. The test probe is particularly useful for use at the damaged portion of the cable. The probe has one end adapted to be connected to a jack at the distal end of a test cable and the other end adapted to be placed in electrical contact with and secured to the wrist of a technician so that the technician's hand functions as the probe.

These and other features of the invention will become more apparent from the following description in which reference is made to the appended drawings.

BRIEF DESCRIPTION OF THE DRAWINGS

FIG. 4 is a circuit schematic of the present invention.

DESCRIPTION OF THE PREFERRED EMBODIMENT

Figure 1:
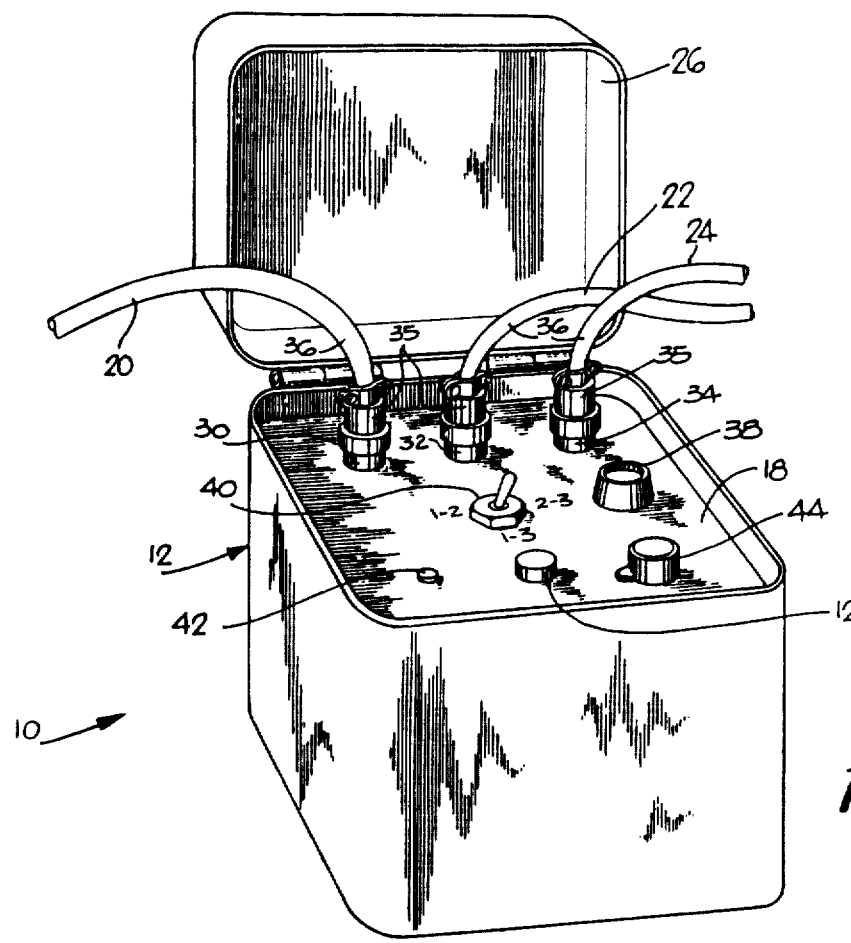
FIG. 1 is a perspective view of a circuit tester carrying case in an opened condition illustrating the front panel of the circuit tester.

FIG. 1 illustrates various components of the continuity testing apparatus 10 of the present invention. In general, the apparatus includes a carrying case 12, in which an electrical circuit 14 (FIG. 4), a d.c. source of power 16 (FIG. 4) and a control panel 18 are disposed, in addition to three test cables 20, 22 and 24. The carrying case is formed with a lid 26 which is shown in an opened position exposing the control panel.

Mounted on control panel 18 are three jacks 30, 32 and 34, each of which is adapted to be connected to a plug 35 at the proximal end 36 of the test cables 20, 22 and 24 respectively, and external power jack 38 for connection to an external source of power if so desired, a selector switch 40 for activating, in a manner to be explained later, any two of the three test cables, a visual continuity indicator 42 for providing a visual indication of continuity, and a gain control switch 44 for adjusting the gain of a tone signal which provides an audible indication of continuity.

Figure 2:
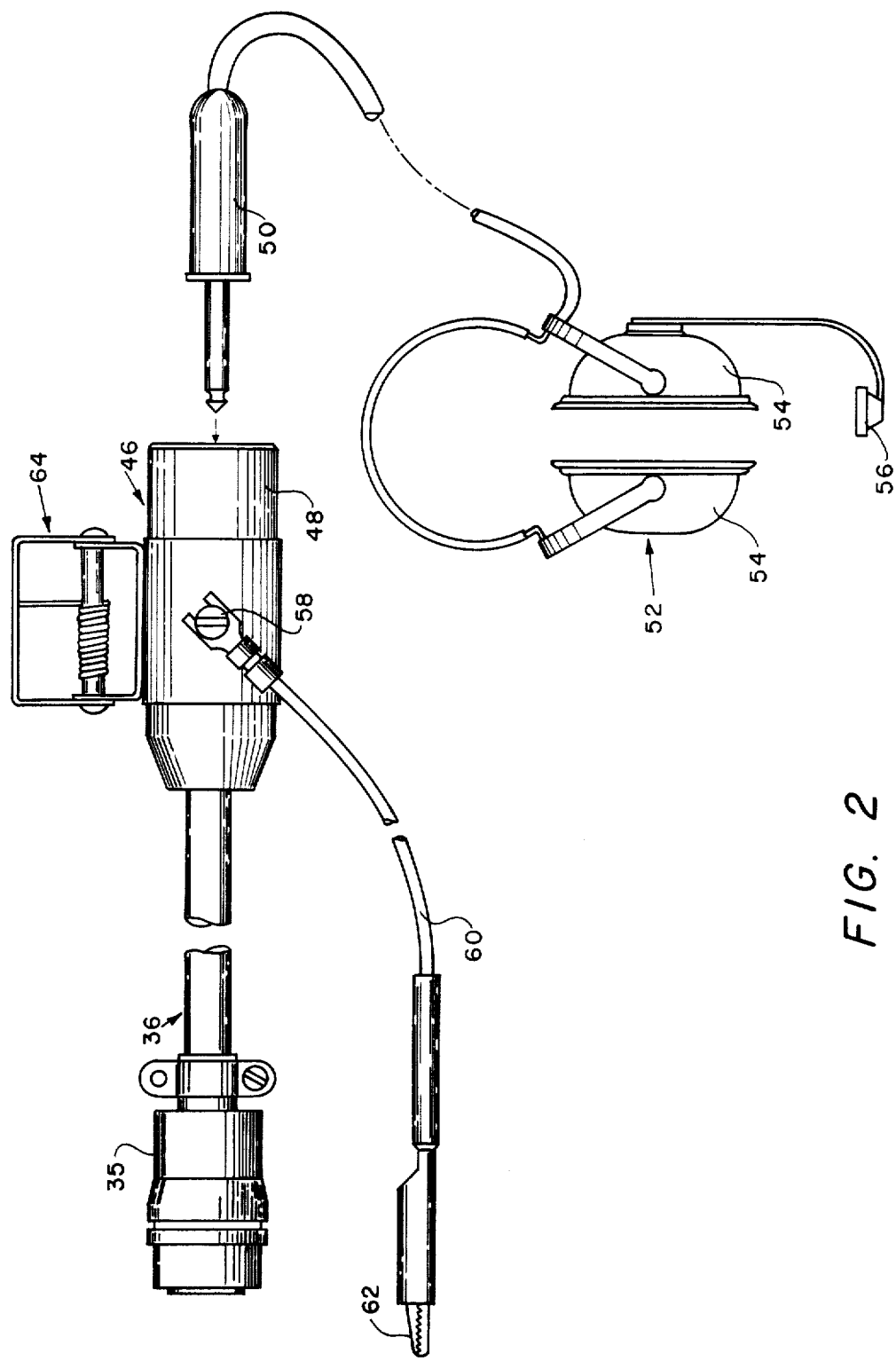
FIG. 2 illustrates one of the test cables and a test lead extending from a distal end thereof.

With reference to FIG. 2, the distal end 46 of each test cable is provided with a jack 48 for removable attachment thereto of a plug 50 of a headset 52, which includes at least one earphone 54 and a microphone 56. The distal end 46 of each test cable is also provided with a test lead terminal or jack 58 for connection to a test lead 60, the free end of which is provided with a probe 62, such as an alligator clip, for use in making electrical contact with an end of a conductor to be tested. Advantageously, the distal end 46 of each cable is provided with a clip 64 arranged to be attached to the belt, or the like, of a technician. The control cable 22 is for use by a technician, hereinafter referred to as MAN 2, at the point of severance of the damaged cable. MAN 2 operates the apparatus and, accordingly, cable 22 need not be very lengthy. A length in the order of 10 feet is sufficient. Cables 20 and 24 are for use by technicians, hereinafter referred to as MAN 1 and MAN 3, respectively, at the remote ends of the damaged cable and thus should be relatively lengthy. A length in the order of 75 feet is considered adequate.

Figure 3:
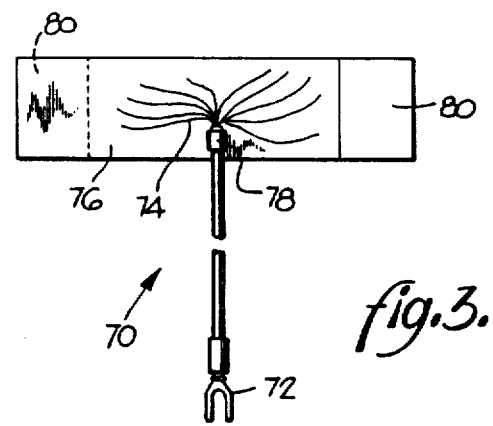
FIG. 3 illustrates a test lead for use in attachment to a portion of the skin, such as that of the wrist, of a technician.

FIG. 3 illustrates a test lead assembly 70 for use by MAN 2 stationed at the location of severance of the cable to be repaired. Test lead assembly 70 includes a fork terminal 72 adapted to be connected to terminal 58 of test cable 22. The bared opposite end 74 of the test lead 70 is secured to a strip of electrically conductive foam 76 by means of a tie wrap 78. Strips of a hook and loop type detachable adhesive 80, known as Velcro ®, are secured to opposite sides and at the ends of strip 76 for attachment of the strip to the technician's wrist so that the technician's hand serves as a test probe. The hand is used to make electrical connection between the damaged central cable and test lead which connects to the circuit of FIG. 4.

FIG. 4 is a schematic of the electrical components and circuitry disposed within carrying case 12. The electrical circuitry 14 includes a circuit board 82, indicated by chain-dotted line 83, on which a number of the components are mounted as will be described.

Each of jacks 30, 32 and 34 includes a pair of terminals 84 and 85 which are adapted to be connected to the microphone terminals of each of headsets 52 via a test cable. The common inputs from the microphones are connected via terminals 84 and 85 to the input of an audio amplifier 86 having a potential divider 88 for adjusting the gain of the audio signal to a desired level. The output of amplifier 86, together with a tone input received from a multivibrator 90 via tone gain control switch 44, is applied to a second audio amplifier 92. The output of amplifier 92 is fed to each of three buffers, each of which is comprised of a pair of operational amplifiers 94 and a transformer 96 and associated with one of the three headsets 52. The buffers are provided to avoid impedance matching problems when only two headsets are connected to the circuit. The output of each transformer 96 is connected to a terminal 98 of an associated jack 30, 32 or 34 as shown.

Each jack 30, 32 and 34 further includes a terminal 100 connected to appropriate terminals of a three position selector switch 40 as shown and for connection, via plugs 35, to terminals 58 of cables 20, 22 and 24. Switch 40 serves to connect in pairs the test probe of the three test cables to the circuit. Position 1-2 of the switch, shown externally in FIG. 1, activates the test probes associated with cables 20 and 22, position 2-3 activates those associated with cables 22 and 24 while position 1-3 activates those associated with cables 20 and 24. One terminal 102 of switch 40 is connected to a signal source 103 while another terminal 104 of switch 40 is connected to a threshold detection circuit 106.

Circuit 106 includes a resistor 108 and diodes 110 and 112 to protect the circuitry against external voltages accidentally applied to its sensor lead. Resistor 108 is connected to the base of a transistor 114 whose emitter voltage is applied to the pin 3 of an operational amplifier 109 functioning as a level detector. A threshold level potential is applied to pin 2 of detector 109, the threshold level being selectively adjustable by a potentiometer 116.

As previously mentioned, resistors 108 and diodes 110 and 112 protect the circuitry against external voltages accidentally applied at the sensor leads. Should the input be raised to $+117$ volts, resistor 108 allows approximately 2 ma to flow via diode 110 into a positive supply terminal. Should the input be lowered to $-117$ volts, resistor 108 allows approximately 2 ma to flow via diode 112 from a negative supply terminal.

The output of detector 109 is applied to visual indicator 42, which is of the form of a light emitting diode (LED), an audio indicator or buzzer 115, and multivibrator 90. In response to an output signal from detector 109, multivibrator 90 generates a square wave train which is applied to a terminal 44$b$ of switch 44 which, in turn, as previously mentioned, applies a tone signal to the input of amplifier 92. The frequency of the tone signal generated by multivibrator 90 may be adjusted internally by potentiometer 118.

Power is normally supplied to the circuit by an internal battery pack 120 comprised of four D cells providing a nominal 6 vdc. In addition, an external source of power of 12 to 30 vdc may be supplied via jack 38. This potential is regulated to 8 vdc by a voltage regulator 122 which is protected against reverse polarity by diode 124. The output of regulator 122 is applied to terminal 44$a$ of switch 44 via fuse 126. A pair of diodes 128 and 130 are provided to avoid the need of manual switching. When 8 vdc is present, diode 128 is back biased resulting in no current drain from battery pack 120. Fuse 126 is provided to protect the power supply against both external shorts from damaged cables and application of unwanted external voltages through the test cables.

It will be understood that when plugs 35 of the test cables 20, 22 and 24 are connected to jacks 30, 32 and 34 respectively and the headsets are connected to jacks 48 (FIG. 2) of the test cables, three technicians are enabled to test the continuity of conductors and communicate with one another.

When is is desired to test the continuity of conductors in a severed cable, MAN 2, employing cable 22 and case 12, is located at the point of severance of the cable while MAN 1 and MAN 3 are located at the opposite ends of the cable to be tested. MAN 2 first positions switch 40 to its 1-2 position so as to activate probes 60 associated with cables 20 and 22. After MAN 1 connects his test probe to the end of a conductor at his end of the damaged cable, MAN 2 sequentially touches or makes electrical contact with, depending upon the test probe used, the end of each of the conductors leading to MAN 1. When contact is made with the end of the conductor to which MAN 1's probe is connected, continuity is established and sufficient voltage is routed to the base of transistor 114 so as to bias it "on". The voltage developed across resistor 108 is compared by detector 109 with the threshold determined by sensitivity adjustment potentiometer 116. When this threshold is broken, detector 109 triggers LED 42, buzzer 115 and multivibrator 90. Multivibrator 90, in turn, applies a tone signal to the input of amplifier 92 via switch 44, which signal is heard by each of the three technicians via their headsets.

As one conductor on one side of the cable has been identified, MAN 2 then positions switch 40 to the 2-3 position so as to deactivate cable 20 and activate cable 24. The above described procedure is repeated until the mate of the identified conductor has been located. After repair of the conductor, MAN 2 positions switch 40 to 1-3 and MAN 1 and MAN 3 connect their test probes to their respective ends of the conductor just identified. A tone signal should be detected over the headsets if the conductor was properly identified and repaired. The procedure is repeated for each of the remaining conductors of the damaged cable.

It will be understood that various changes and modifications may be made to the aforedescribed invention without departing from the spirit of the appended claims.

What is claimed is:

1. A conductor continuity testing apparatus for tracing and restoring continuity of a plurality of conductors, comprising:
   first, second and third test cables, each said cable having a proximal end and a distal end, the distal end of each said test cable including electrical connection means for connecting to respective opposite ends of said plurality of conductors to be tested, one of said cables having electrical connection means for connecting to intermediate ends of a damaged section along the length of said conductors;
   a source of input signal;
   a detector adapted to provide an output signal in response to an input signal from said source exceeding a predetermined threshold level;
   switch means for selectively connecting the proximal end of each of said cables to said signal source and the proximal end of each other of the remaining cables to said detector, said switch means having three positions including a first position activating electrical connection means at respective ends of conductors between one opposite end and said intermediate end, a second position activating electrical connection means at respective ends of conductors between the other opposite end and said intermediate end, and a third position activating electrical connection means at respective ends between said one opposite end and said other opposite end; and
   indicator means responsive to said output signal for providing an indication of current flow upon completion of a circuit connection through one of said conductors connected between the distal ends of said cables.

2. The apparatus as defined in claim 1, wherein said indicator means is an audio indicator.

3. The apparatus as defined in claim 1, wherein said indicator means is a visual indicator.

4. The apparatus as defined in claim 3, wherein said visual indicator is a light emitting diode.

5. The apparatus as defined in claim 1, wherein said indicator means includes;
   a receptacle connected to the distal end of each said test cable;
   a probe for engaging said receptacle;
   a headset including an earphone connected to said probe associated with the distal end of each said cable; and
   pulse signal generating means connected to said detector for receiving said output signal and to each said headset via said cables for providing an audio signal to each said earphone in response to said output signal.

6. The apparatus as defined in claim 5, including amplifier means for amplifying said audio signal and gain control means for selectively adjusting the gain of said audio signal.

7. The apparatus as defined in claim 5, wherein each said headset includes a microphone, each said microphone communicating with said earphones via said cables.

8. The apparatus as defined in claim 7, including further amplifier means for amplifying microphone signals and buffer means coupling the output of said further amplifier means to the earphones of each of said head sets.

9. The apparatus as defined in claim 5, wherein said indicator means further includes an audio indicator and a visual indicator.

10. A conductor continuity testing apparatus for tracing and restoring continuity of conductors of an electrical cable, comprising:
   first, second and third test cables each having a distal end and a proximal end;
   first, second and third test probes connected to said first, second and third test cables respectively, two of said probes being adapted to connect the distal end of the associated test cable to respective opposite ends of a plurality of conductors of said electrical cable to be tested, and said third probe being adapted to connect to an intermediate end of a damaged conductor section;
   first second and third headsets associated with and adapted to be connected to the distal end of said first, second and third test cables respectively, each headset having at least one earphone and a microphone; and
   electrical circuit means adapted to be connected to the proximal ends of each said first, second and third test cables, said circuit means and said test cables connecting said microphones of each said headset to the earphones of each said headset for providing communication between operators wearing said headsets, said circuit means including a signal source and continuity indicator means and switch means for selectively connecting the test probe associated with any one of said test cables to said signal source and the test probe associated with any one of the remaining cables to said indicator means, said switch means having three positions including a first position activating electrical connection of respective said test probes at respective ends of conductors between one opposite end and said intermediate end, a second position activating electrical connection of respective said test probes at respective ends of conductors between the other opposite end and said intermediate end, and a third position activating electrical connection of respective said test probes at respective ends between said one opposite end and said other opposite end, said indicator means providing an indication of the completion of a signal path through one of said conductors connected between the distal ends of said test cables.

11. The apparatus as defined in claim 10, wherein said circuit means further includes amplifier means having an input connected to each said microphone and an output connected to each said earphone via said test cables.

12. The apparatus as defined in claim 11, wherein said circuit means further includes buffer means connected between the output of said amplifier means and each said earphone via said test cables.

13. The apparatus as defined in claim 10, wherein said circuit means further includes a detector adapted to provide an output signal in response to an input signal from said source exceeding a predetermined threshold level, said indicator means being responsive to said output signal for providing an indication of current flow through a conductor connected between the test probe of one test cable and the test probe of one of the remaining cables.

14. The apparatus as defined in claim 13, wherein said switch means selectively connects the test probe of said any one of said test cables to said signal source and the test probe of said any one of said remaining cables to said detector.

15. The apparatus as defined in claim 13 wherein said indicator means is an audio indicator.

16. The continuity testing apparatus as defined in claim 10, wherein at least one of said test probes includes an electrical conductor having a first end adapted to be connected to said electrical circuit for testing the continuity of a conductor of a damaged cable and a second end adapted to be connected to the skin of an individual using said apparatus for communicating an electrical potential between said test probe conductor and said damaged cable conductor when said individual touches said damaged cable conductor.

17. The continuity testing apparatus as defined in claim 16, further including a strip of electrically conductive material electrically connected to said second end of said test probe conductor, said strip being adapted to be wrapped about the wrist of said individual, and means for securing said strip about the wrist of said individual.

18. The continuity testing apparatus as defined in claim 17, wherein said securing means is a hook and loop type detachable adhesive.

* * * * *